(12) United States Patent
Bates et al.

(10) Patent No.: US 9,057,004 B2
(45) Date of Patent: Jun. 16, 2015

(54) SLURRY FOR CHEMICAL-MECHANICAL POLISHING OF METALS AND USE THEREOF

(75) Inventors: Graham M. Bates, Waterbury, VT (US);
Michael T. Brigham, Bolton, VT (US);
Joseph K. Comeau, Alburgh, VT (US);
Jason P. Ritter, Jericho, VT (US);
Matthew T. Tiersch, Essex Junction, VT (US); Eva A. Shah, Essex Junction, VT (US); Eric J. White, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 467 days.

(21) Appl. No.: 13/241,383

(22) Filed: Sep. 23, 2011

(65) Prior Publication Data

US 2013/0078811 A1    Mar. 28, 2013

(51) Int. Cl.
| | |
|---|---|
| *C09G 1/02* | (2006.01) |
| *H01L 21/321* | (2006.01) |
| *C09K 3/14* | (2006.01) |
| *H01L 21/768* | (2006.01) |
| *C11D 11/00* | (2006.01) |

(52) U.S. Cl.
CPC .............. *C09G 1/02* (2013.01); *C11D 11/0047* (2013.01); *H01L 21/3212* (2013.01); *C09K 3/1463* (2013.01); *C09K 3/1472* (2013.01); *H01L 21/7684* (2013.01)

(58) Field of Classification Search
CPC ........................ C11D 11/0047; H01L 21/3212
See application file for complete search history.

(56) References Cited

U.S. PATENT DOCUMENTS

| | | | |
|---|---|---|---|
| 5,759,982 A | 6/1998 | Wise et al. | |
| 6,569,349 B1 | 5/2003 | Wang et al. | |
| 6,623,355 B2 * | 9/2003 | McClain et al. | 451/60 |
| 6,689,223 B1 | 2/2004 | Meine et al. | |
| 6,812,193 B2 * | 11/2004 | Estes et al. | 510/175 |

OTHER PUBLICATIONS

International Search Report (Mail Date Nov. 19, 2012) for PCT/US Application No. 12/54549; 14 pages.

* cited by examiner

*Primary Examiner* — Gregory Webb
(74) *Attorney, Agent, or Firm* — Schmeiser, Olsen & Watts; David Cain

(57) ABSTRACT

A composition and a method for chemical mechanical polishing. The composition includes a surfactant anion an alkyl alcohol and a diluent. The composition further includes abrasive particles and an oxidizer. The method includes providing the composition on a surface to be polished and polishing the surface by contacting the surface with a polishing pad.

18 Claims, 8 Drawing Sheets

SLURRY FOR CHEMICAL-MECHANICAL POLISHING OF METALS AND USE THEREOF

FIELD OF THE INVENTION

The present invention relates to slurry compositions that are useful for polishing or planarizing a surface. The present invention is especially useful for polishing or planarizing copper used as interconnect wiring in integrated circuit devices such as semiconductor wafers containing copper damascene and dual damascene wires. The present invention also relates to polishing processes employing the compositions of the present invention.

BACKGROUND

When chemical-mechanical polishing is used to form damascene and dual-damascene wires during the fabrication of integrated circuits the uniformity of the polishing process is most important in reducing defects and increasing yields. The industry is always welcoming to improved polishing methods. The embodiments of the present invention provide a significant increase in uniformity of the chemical-mechanical polishing process.

SUMMARY

A first aspect of the present invention is a composition, comprising: a minimum of about 32% by weight of a surfactant anion; between about 0.8% by weight and about 1.2% by weight of an alkyl alcohol; and a diluent.

A second aspect of the present invention is a composition, consisting essentially of: a minimum of about 32% by weight of a surfactant anion; between about 0.8% by weight and about 1.2% by weight of an alkyl alcohol; and a diluent.

A third aspect of the present invention is a slurry composition, comprising: between about 0.5% by weight and about 6% by weight abrasive particles; between about 1 gm/liter and about 50 gm/liter of an oxidizer; between about 0.1 ml/liter and about 100 ml/liter of surfactant anion; between about 0.003 ml/liter and about 3.05 ml/liter of an alkyl alcohol; and a diluent.

A fourth aspect of the present invention is a slurry composition, consisting essentially of: between about 0.5% by weight and about 6% by weight abrasive particles; between about 1 gm/liter and about 50 gm/liter of an oxidizer; between about 0.1 ml/liter and about 100 ml/liter of surfactant anion; between about 0.1 gm/liter and about 5 gm/liter of a copper corrosion inhibitor; between about 0.003 ml/liter and about 3.05 ml/liter of an alkyl alcohol; and a diluent.

A fifth aspect of the present invention is a method, comprising: providing a slurry composition according to the third aspect on a surface to be polished; and polishing the surface by contacting the surface with a polishing pad.

A sixth aspect of the present invention is a method, comprising: providing a slurry composition according to the fourth aspect on a surface to be polished; and polishing the surface by contacting said surface with a polishing pad.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

Figure 1A:
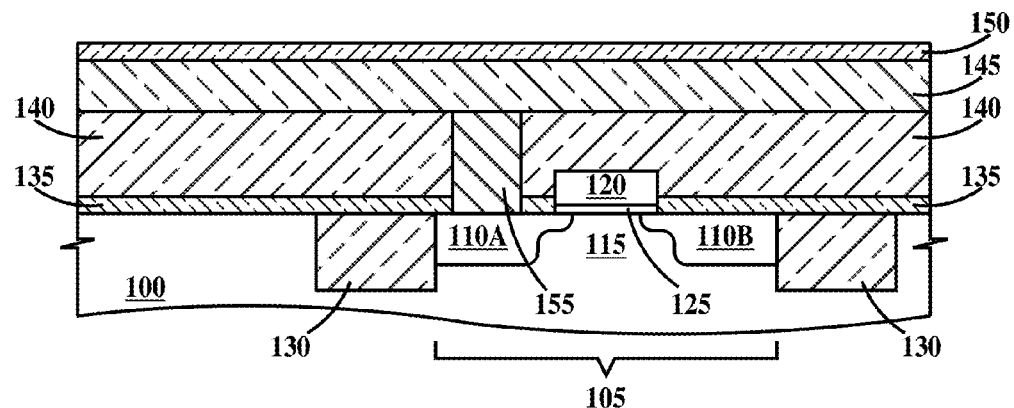
FIGS. 1A through 1H are cross-sectional views illustrating an exemplary method of fabricating a damascene wire of an integrated circuit according to embodiments of the present invention.

A surfactant composition according to embodiments of the present invention includes an alkyl alcohol and a surfactant. This surfactant composition is added to a chemical-mechanical-polish (CMP) slurry used for polishing damascene and dual-damascene wires during fabrication of integrated circuits. The inclusion of an alkyl alcohol in the CMP slurry composition acts to increase the uniformity of the polishing process without increasing the amount of corrosion of the wires by reducing the surface tension of the slurry.

A damascene process is one in which wire trenches are formed in a dielectric layer and an electrical conductor of sufficient thickness to fill the trenches is deposited in the trenches and on a top surface of the dielectric. A CMP process is performed to remove excess conductor and make the surface of the conductor co-planar with the surface of the dielectric layer to form damascene wires. There are two types of dual-damascene processes. A via first dual-damascene process is one in which via openings are formed through the entire thickness of a dielectric layer followed by formation of trenches part of the way through the dielectric layer in any given cross-sectional view. A trench first dual-damascene process is one in which trenches are formed part way through the thickness of a dielectric layer followed by formation of vias inside the trenches the rest of the way through the dielectric layer in any given cross-sectional view. An electrical conductor of sufficient thickness to fill the trenches and via opening is deposited on a top surface of the dielectric and a CMP process is performed to make the surface of the conductor in the trench co-planar with the surface the dielectric layer to form dual-damascene wires having integral vias.

Surfactant compositions of embodiments of the present invention include a mixture of a surface active agent (i.e., surfactant) and an alkyl alcohol in water or other suitable solvent such as methanol, ethanol, ethylene glycol and glycerol. Examples of suitable surfactants include Na-alkyl sulfates, Na-alkyl sulfonates, quarternary such as tetramethyl ammonium halides, cetyl trimethy ammonium halides, hydroxides, nonyl ethers and combinations thereof. Preferred surface active agents are sulfates such as Na-hexyl, -heptyl, -octyl, -nonyl and -lauryl sulfates with Na-octyl sulfate being most preferred. Examples of suitable alkyl alcohols include but are not limited to alkyl mono-alcohols having 6 to 14 carbon atoms, straight chain alkyl mono-alcohols having 6 to 14 carbon atoms, straight chain alkyl primary mono-alcohols having 6 to 14 carbon atoms, branched-chain alkyl mono-alcohols, alkyl poly-alcohols having 6 to 14 carbon atoms, straight chain alkyl poly-alcohols having 6 to 14 carbon atoms, straight chain alkyl primary poly-alcohols having 6 to 14 carbon atoms, and branched-chain alkyl poly-alcohols. A primary alcohol is an alcohol where the OH group is connected to a primary carbon atom. A primary alcohol contains a —$CH_2OH$ group. Preferred alkyl alcohols have the formula $C_n(H_2)_{n+1}OH$ where n has a value of 6 to 14. Preferred alkyl alcohols have the formula $CH_3(CH_2)_mOH$ where m has a value between 5 and 13. A preferred alkyl alcohol is 1-octanol.

In one example, surfactant compositions of embodiments of the present invention include between about 0.1% by weight and about 1.5% by weight of alkyl alcohol or a mixture of two or more alkyl alcohols. In one example, surfactant mixtures of embodiments of the present invention include between about 0.1% by weight and about 1.5% by weight of octanol. In one example, surfactant mixtures of embodiments of the present invention includes between about 30% by weight and about 35% by weight of surfactant. In one example, surfactant mixtures of embodiments of the present invention includes between about 30% by weight and about 35% by weight of sodium octyl sulfate.

An exemplary surfactant composition comprises (i) between about 0.8% by weight and about 1.2% by weight alkyl alcohol (e.g., octanol), (ii) a minimum of about 32% by weight of surfactant anions (e.g., octyl sulfate anion of (e.g., sodium octyl sulfate)), and (iii) a diluent (e.g., water). The viscosity of this surfactant composition is no greater than about 150 centipoise at 25° C. A 10% by weight solution of this surfactant composition in water has a pH of between about 7 and about 9. Additionally, the surfactant composition may include a maximum of about 1.0% by weight of a sulfate ion source (e.g., sodium sulfate), and/or a maximum of about 0.1% by weight of a chloride ion source (e.g., sodium chloride).

An exemplary surfactant composition consists essentially of (i) between about 0.8% by weight and about 1.2% by weight alkyl alcohol (e.g., octanol), (ii) a minimum of about 32% by weight of anionic surfactant (e.g., octyl sulfate anion of (e.g., sodium octyl sulfate)), and (iii) a diluent (e.g., water). The viscosity of this surfactant composition is no greater than about 150 centipoise at 25° C. A 10% by weight solution of this surfactant composition in water has a pH of between about 7 and about 9. In one example, in excess of 0.5% by weight of NaCl (0.3% by weight chloride ion) in the surfactant composition was found to more than offset the reduction in dishing due to the presence of the alkyl alcohol. In one example, in excess about 1% by weight of organic amine or ammonium ion ($NH_4+$) was found to more than offset the reduction in dishing due to the presence of the alkyl alcohol.

CMP slurry compositions according to embodiments of the present invention include the aforementioned surfactant/alkyl alcohol composition as a component of the CMP slurry. Alternatively, instead of including a premixed surfactant/alkyl alcohol mixture, CMP slurry compositions according to embodiments of the present invention may include the aforementioned surfactants and alkyl alcohols as separate components. Either way, in one example, CMP slurry compositions according to embodiments of the present invention include between about 0.1 ml/liter and about 100 ml/liter of surfactant and between about 0.003 ml/liter and about 3.05 ml/liter of alkyl alcohol.

CMP slurry compositions according to embodiments of the present invention include an oxidizing agent. Suitable oxidizing agents include oxidizing metal salts, oxidizing metal complexes, oxidizing acids such as nitric, persulfuric, peracetic and periodic acids, iron salts such as nitrates and sulfates; potassium ferricyanide, hydrogen peroxide, aluminum salts, sodium salts, potassium such as potassium iodate, ammonium salts such as ammonium cerium nitrate, phosphonium salts, chlorates, perchlorates such as potassium percholate, nitrates, permaganates such as potassium permanganate, persulfates and mixtures thereof. Preferred oxidizing agents are ferric nitrate and hydrogen peroxide, either together or singly.

In one example, CMP slurry compositions of embodiments of the present invention include between about 1 gm/liter and about 50 gm/liter oxidizer with between about 10 gm/liter and about 40 gm/liter preferred.

CMP slurry compositions according to embodiments of the present invention, when employed to polish copper, also include a copper corrosion inhibitor. When the compositions are used for polishing Al or W, they can and preferably also include a copper corrosion inhibitor. Typical copper corrosion inhibitors include imidozoles, triazoles such as 1,2,4-triazole and benzotriazole. In one example, CMP slurry compositions of embodiments of the present invention include between about 0.1 gm/liter and about 5 gm/liter copper corrosion inhibiter with about 2.5 gm/liter preferred.

CMP slurry compositions according to embodiments of the present invention also include abrasive particles. Examples of suitable abrasive particles include alumina, silica, ferric oxide, zirconia, ceria, and titanium dioxide and mixtures thereof with alumina preferred. Also, the abrasive particles can include a dual-valent rare earth ion or suspension of its colloidal hydroxide, wherein the rare earth ion is in its higher valent form. Examples of some suitable rare earths are $Ce^{4+}$, $Pr^{4+}$ and $Tb^{4+}$ or suspensions of their colloidal oxides, such as cerium oxide. The dual-valent rare earth or rare earth oxide colloid acts as an oxidation catalyst.

In one example, abrasive particles have a particle size of between about 10 nm to about 1000 nm and preferably between about 50 nm and about 200 nm. In one example, CMP slurry compositions of embodiments of the present invention include between about 0.5% by weight and about 6% by weight abrasive particles with between about 2% by weight and about 4% by weight preferred.

Mixtures of abrasives can be employed when desired. An exemplary abrasive mixture includes alumina (between about 0.1% by weight and about 6% by weight), silica (between about 0.1% by weight and about 5% by weight) and zirconia (between about 0.1 to about 6% by weight). Another exemplary abrasive mixture includes alumina (between about 1% by weight and about 5% by weight) and silica (between about 1% by weight and about 20% by weight).

Slurry compositions according to embodiments of the present invention are preferably aqueous slurries. Other types of suitable slurries include those using the organic solvents such as propylene carbonate and mono and polyhydric alcohols such as methanol, ethanol, ethylene glycol and glycerol as diluents. Mixtures of the aforementioned diluents as well as mixtures of the aforementioned diluents with water can be used.

CMP slurry compositions according to embodiments of the present invention also include both a chloride ion source and a sulfate ion source. The chloride ion and sulfate ion sources are typically present as salts including salts of alkali metals such as sodium and potassium; alkaline earth metals such as calcium; and ammonia. A preferred chloride ion source is sodium chloride, and preferred sulfate ion source is sodium sulfate.

In one example, the amount of chloride ion source is between about 0.001 gm/liter and about 5 gm/liter with between about 0.05 gm/liter and about 0.1 gm/liter preferred. In one example, the amount of sulfite ion source is between about 0.001 gm/liter and about 20 gm/liter with between about 1 gm/liter and about 3 gm/liter preferred. All or part of the allowable amount of chloride ion source may be supplied by the surfactant composition. All or part of the allowable amount of sulfate ion source may be supplied by the surfactant composition.

The CMP slurry compositions of embodiments of the present invention are useful for polishing copper (Cu), tungsten (W), and aluminum (Al), alloys of copper, alloys of aluminum and alloys of tungsten and is selective to Cu, W and Al with respect to titanium (Ti), titanium nitride (TiN), tantalum (Ta) and tantalum nitride (TaN). The surfactant/alkyl alcohol compositions of the present invention and especially the preferred concentrations of the components result in reduced dishing of Cu wires at low without excessive corrosion. (see FIG. 4).

An exemplary CMP slurry for forming damascene and dual-damascene copper wires during the fabrication of integrated circuits comprises (i) between about 0.5% by weight and about 6% by weight abrasive (e.g., alumina) with between about 2% by weight and about 4% by weight preferred, (ii) between about 1 gm/liter and about 50 gm/liter of an oxidizer (e.g., ferric nitrate) with between about 10 gm/liter and about 40 gm/liter preferred, (iii) between about 0.1 ml/liter and about 100 ml/liter of surfactant anion (e.g., octyl sulfate anion of (e.g., sodium octyl sulfate)) (iv) between about 0.1 gm/liter and about 5 gm/liter a copper corrosion inhibitor (e.g., benzothiazole) with about 2.5 gm/liter preferred), (v) between about 0.003 ml/liter and about 3.05 ml/liter of an alkyl alcohol (e.g., octanol), and (vi) a diluent (e.g., water). Additionally, the slurry composition may include between about 0.001 gm/liter and about 5 gm/liter of a chloride ion source (e.g., sodium chloride) with between about 0.05 gm/liter and about 0.1 gm/liter preferred and/or between about 0.001 gm/liter and about 20 gm/liter a sulfate ion source (e.g., sodium sulfate) with between about 1 gm/liter and about 3 gm/liter preferred.

An exemplary CMP slurry for forming damascene and dual-damascene copper wires during the fabrication of integrated circuits consists essentially of (i) between about 0.5% by weight and about 6% by weight abrasive (e.g., alumina) with between about 2% by weight and about 4% by weight preferred, (ii) between about 1 gm/liter and about 50 gm/liter of an oxidizer (e.g., ferric nitrate) with between about 10 gm/liter and about 40 gm/liter preferred, (iii) between about 0.1 ml/liter and about 100 ml/liter of surfactant anion (e.g., octyl sulfate anion of (e.g., sodium octyl sulfate)), (iv) between about 0.1 gm/liter and about 5 gm/liter a copper corrosion inhibitor (e.g., benzotriazole) with about 2.5 gm/liter preferred), (v) between about 0.003 ml/liter and about 3.05 ml/liter of an alkyl alcohol (e.g., octanol), and (vi) a diluent (e.g., water). It is advantageous that there is less than 1% by weight of sodium citrate, $NaNO_3$, $Na_2HPO_4$, sodium oxalate, $Na_2SiF_6$ and NaF n the slurry composition. In one example, in excess of 0.5% by weight of NaCl (0.3% by weight chloride ion) in the slurry composition was found to more than offset the reduction in dishing due to the presence of the alkyl alcohol. In one example, in excess of about 1% by weight of organic amine or ammonium ion ($NH_4+$) in the slurry composition was found to more than offset the reduction in dishing due to the presence of the alkyl alcohol.

FIGS. 1A through 1H are cross-sectional views illustrating an exemplary method of fabricating a damascene wire of an integrated circuit according to embodiments of the present invention. In FIG. 1A, a semiconductor substrate 100 includes a field effect transistor (FET) 105 including source drains 110A and 110B separated by a channel region 115 (of substrate 100) under a gate 120. Gate 120 is electrically isolated from source/drains 110A and 110B and channel region 115 by a gate dielectric 125. A perimeter of FET 105 is surrounded by trench isolation 130. Trench isolation is formed in substrate 100. Formed on substrate 100 is a dielectric copper diffusion barrier layer 135. Formed on barrier layer 135 is a dielectric layer 140. Formed on a top surface of dielectric layer 140 is an interlevel dielectric (ILD) layer 145 and formed on a top surface of ILD 145 is a dielectric hardmask layer 150. Formed in dielectric layer 140 and extending from a top surface of dielectric layer 140, through barrier layer 135 to a top surface of substrate 100 is an electrically conductive stud contact 155.

Figure 1B:
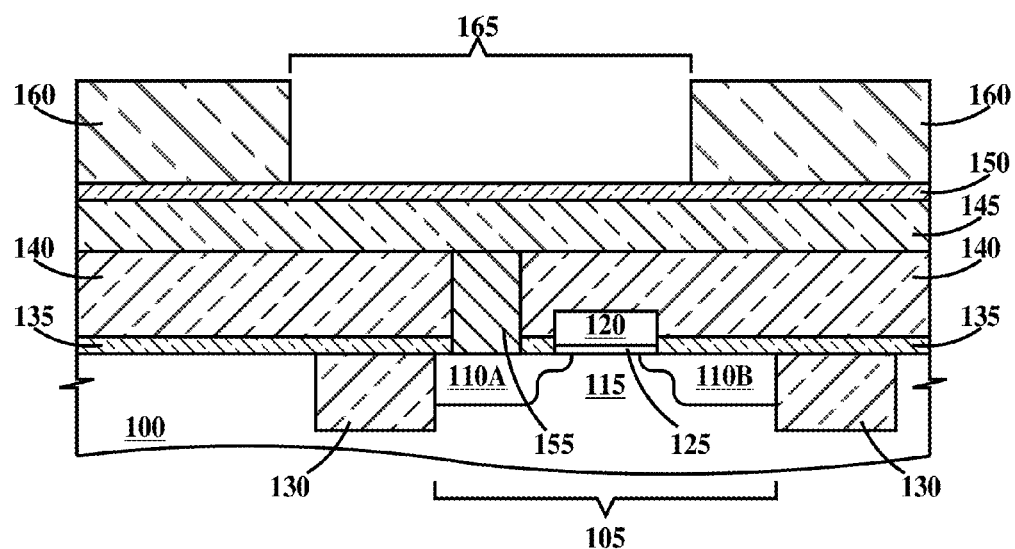

In FIG. 1B, a patterned photoresist layer 160 is formed having an opening 165 therein using a photolithographic process. A photolithographic process is one in which a photoresist layer is applied to a surface of a substrate, the photoresist layer exposed to actinic radiation through a patterned photomask and the exposed photoresist layer developed to form a patterned photoresist layer. When the photoresist layer comprises positive photoresist, the developer dissolves the regions of the photoresist exposed to the actinic radiation and does not dissolve the regions where the patterned photomask blocked (or greatly attenuated the intensity of the radiation) from impinging on the photoresist layer. When the photoresist layer comprises negative photoresist, the developer does not dissolve the regions of the photoresist exposed to the actinic radiation and does dissolve the regions where the patterned photomask blocked (or greatly attenuated the intensity of the radiation) from impinging on the photoresist layer. The photoresist layer may optionally be baked at one or more of the following steps: prior to exposure to actinic radiation, between exposure to actinic radiation and development, after development. A top surface of polish stop later 150 is exposed in the bottom of opening 165.

Figure 1C:
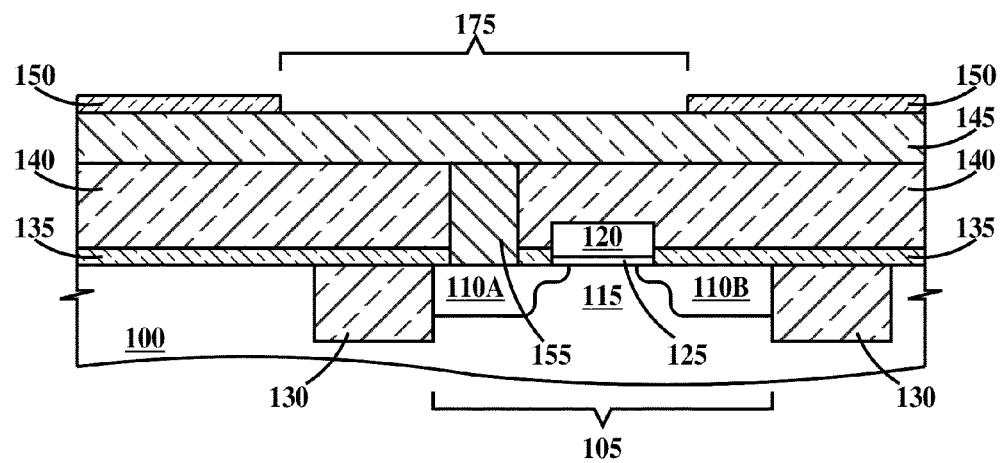

In FIG. 1C, hardmask layer 150 has been removed (i.e., by reactive ion etch (RIE)) where not protected by patterned photoresist layer 160 (see FIG. 1B) to form a trench 175 and the patterned photoresist layer removed. The top surface of ILD 145 is exposed in the bottom of trench 175.

Figure 1D:
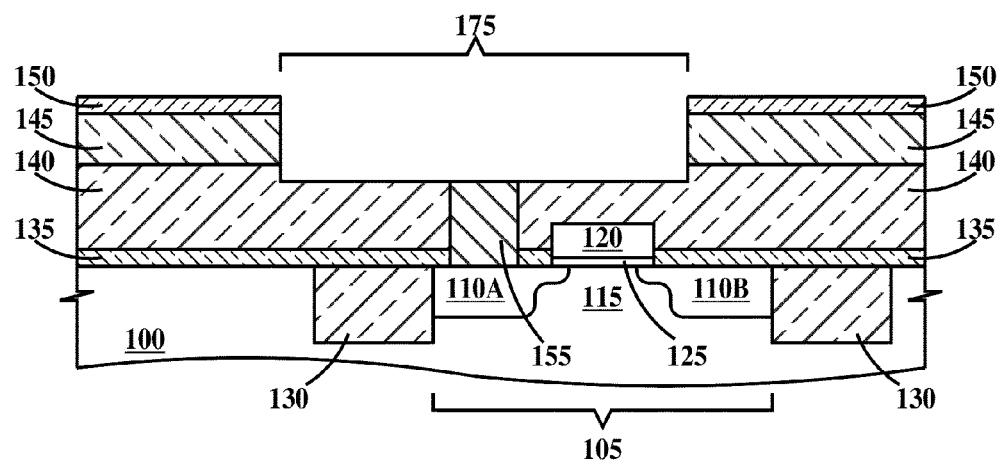

In FIG. 1D, trench 175 is extended through ILD 145 into dielectric layer 140 (i.e., using hardmask layer 150 as a patterned hardmask for an RIE process). Trench 175 is recessed into dielectric layer 140 deep enough to expose at least the top surface of stud contact 155.

Figure 1E:
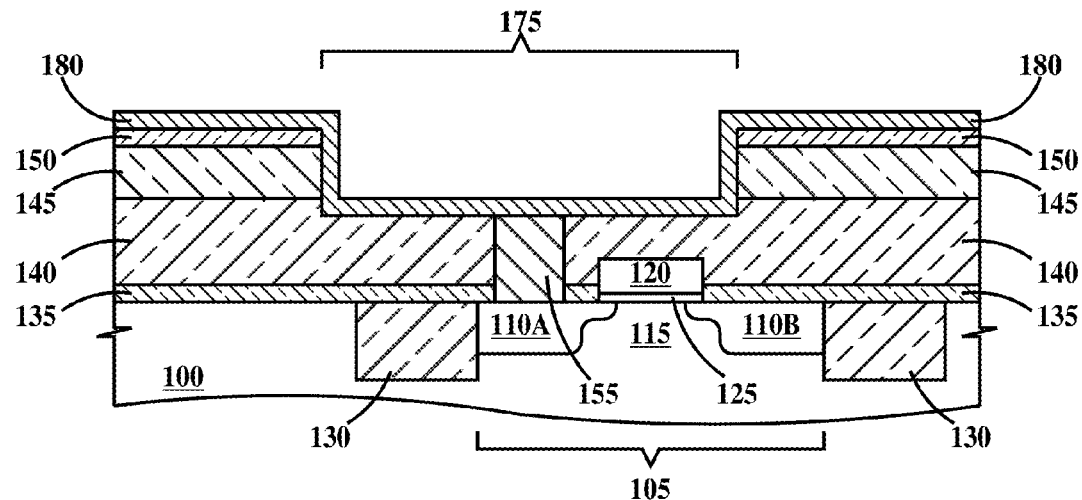
Figure 1F:
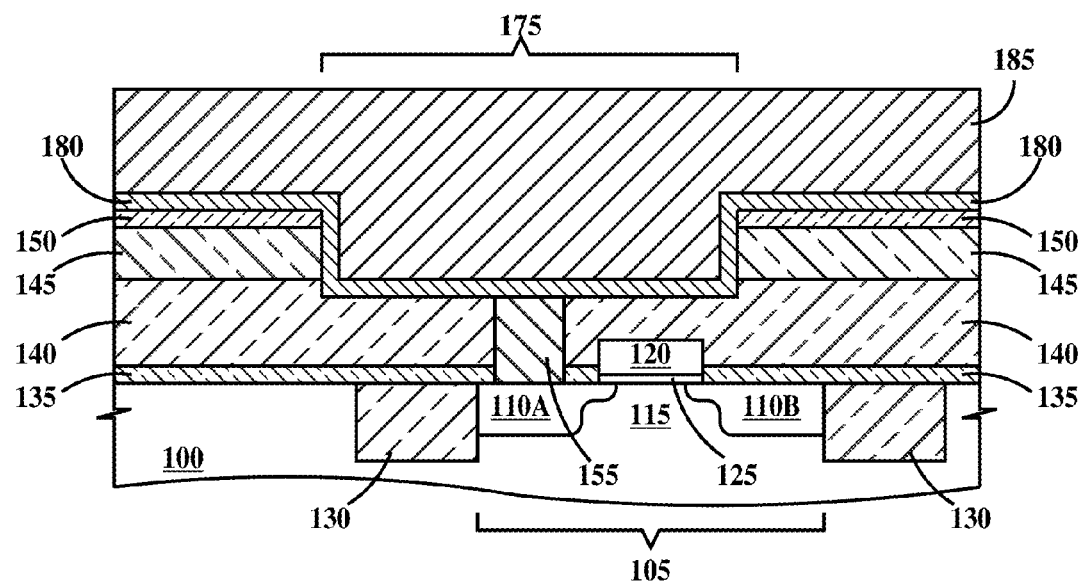

In FIG. 1E, an electrically conductive liner layer 180 is formed on the top surface of hardmask layer 150, and previously exposed surfaces of dielectric layer 140, ILD layer 145, hardmask layer 150 and stud contact 155 in trench 175. In FIG. 1F, an electrically conductive core conductor layer 185 is formed on a top surface of liner layer 180 so trench 175 is completely filled.

Figure 1G:
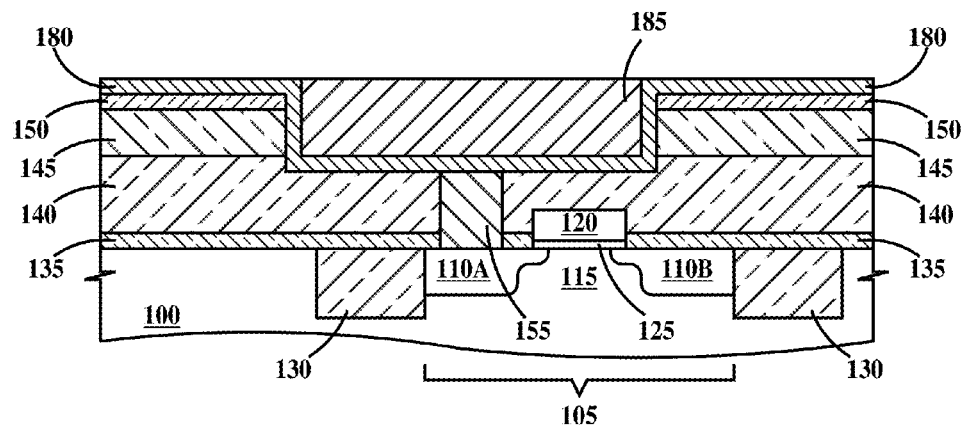
Figure 1H:
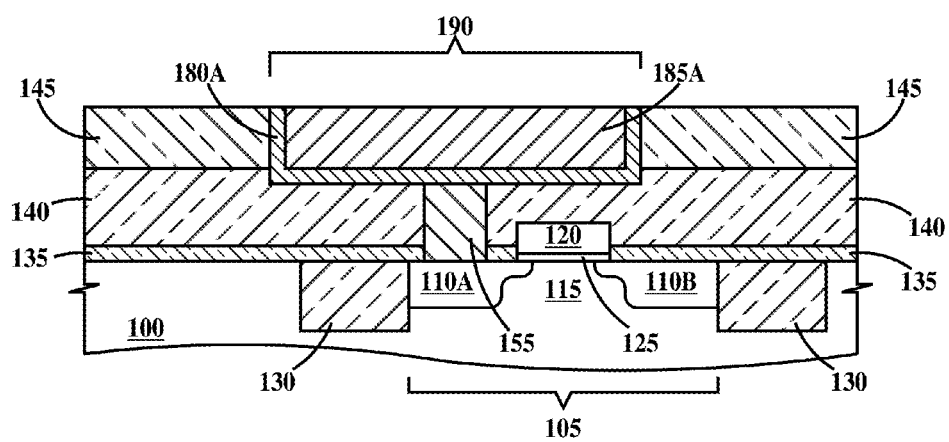

In FIG. 1G, a first CMP process is performed to coplanarize the top surfaces of core conductor layer 185 and liner layer 180. In FIG. 1H, a second CMP process is performed to remove regions of liner layer 185 that are on hardmask layer 150 and to remove hardmask layer 150 (see FIG. 1G) and coplanarize the top surface of ILD 145 and a damascene wire 190. Damascene wire 190 consists of a core conductor 185A having a liner 180A on its bottom surface and sidewalls, where liner 180A was derived from liner layer 180 and core conductor was derived from core conductor layer 185. The first and second CMP processes utilize the slurry compositions described supra.

Figure 2:
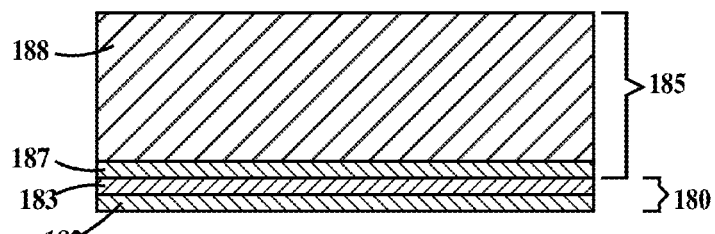
FIG. 2 is a cross-sectional view illustrating the electrically conductive layers used to fabricate exemplary damascene and dual damascene wires according to embodiments of the present invention.

FIG. 2 is a cross-sectional view illustrating the electrically conductive layers used to fabricate exemplary damascene and dual damascene wires according to embodiments of the present invention. In FIG. 2, liner layer 180 includes a first layer 182 and a second layer 183. In one example, first layer 182 is TiN and second layer 183 is Ti. In one example, first layer 182 is TaN and second layer 183 is Ta. Core conductor layer 185 includes an evaporated copper seed layer 187 and a plated copper layer 188. Copper seed layer 187 is formed on second layer 183.

Figure 3:
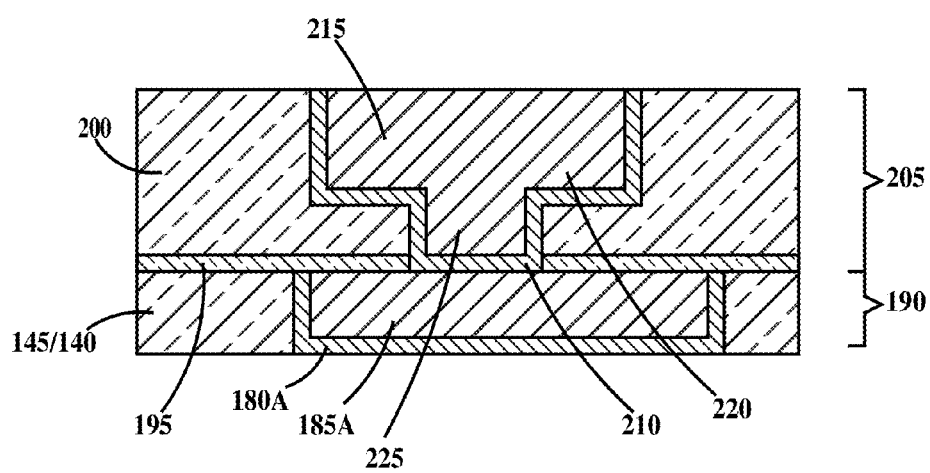
FIG. 3 is a cross-section view illustrating an exemplary dual-damascene wire contacting a damascene wire according to embodiments of the present invention.

FIG. 3 is a cross-section view illustrating an exemplary dual-damascene wire contacting a damascene wire according to embodiments of the present invention. In FIG. 3, an additional dielectric copper diffusion barrier layer 195 is formed on the top surfaces of damascene wire 190 and an additional ILD layer 200 formed on barrier layer 195. ILD layer 200 may include multiple dielectric layers. A dual damascene wire 205 is formed in ILD 200. Wire 205 includes an electrically conductive liner 210 and a core conductor 215. Wire 205 includes a wire portion 220 and a via portion 225. Via portion 225 of wire 205 physically and electrically contacts wire 190. The materials for wire 205 are the same as described for wire 190. The CMP processes used to form wire 205 are similar to the CMP processes used to form wire 190 including the slurry.

Figure 4:
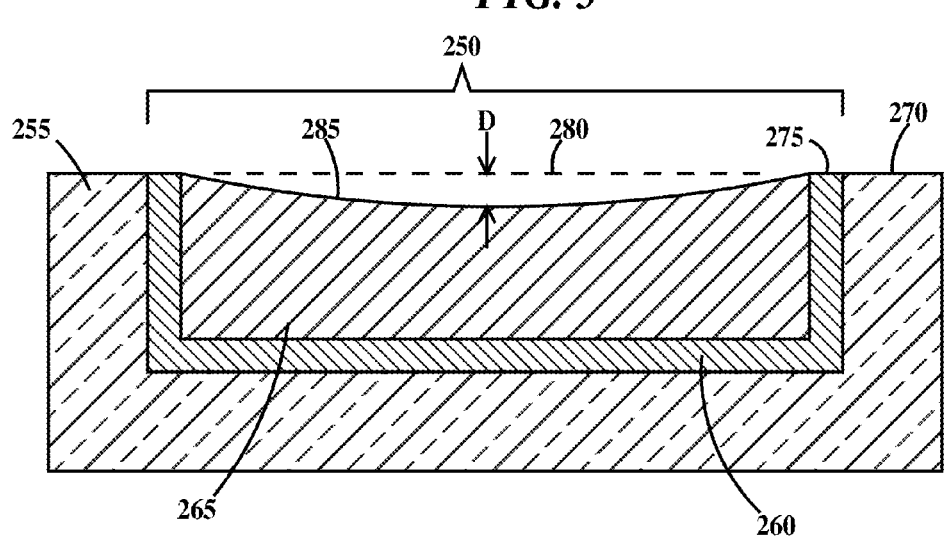
FIG. 4 is a cross-section view illustrating a dishing defect in an exemplary damascene wire.

FIG. 4 is a cross-section view illustrating a dishing defect in an exemplary damascene wire. In FIG. 4, a damascene wire 250 is formed in a dielectric layer 255. Wire 250 includes an electrically conductive liner 260 and a core conductor 265. ILD layer 255 has a top surface 270. The top surface of the exposed edge 275 of liner 260 is coplanar with top surface 270 of ILD layer 255. The dashed line 280 indicates the desired top surface of core conductor 265 after CMP. The actual top surface 285 is dished or concave relative to dashed line 280. Top surface 285 is dished a maximum distance D. When the value of D exceeds a target value for a given wiring level, defects such a shorts between wires on the same wiring level can occur. In one example, D is between about 0 Å and about 2000 Å. D can not be negative.

An integrated circuit may utilize multiple wiring levels employing copper damascene and dual damascene wire. One or more of the multiple levels may be fabricated using fabrication steps described for wires 190 and 205. One or more of the multiple levels may be fabricated using a CMP slurry according to embodiments of the present invention. One or more of the ILD dielectric layers described supra may comprise a low-K dielectric material. A low K dielectric material is defined as a material having a permittivity of 3 or less.

Figure 5:
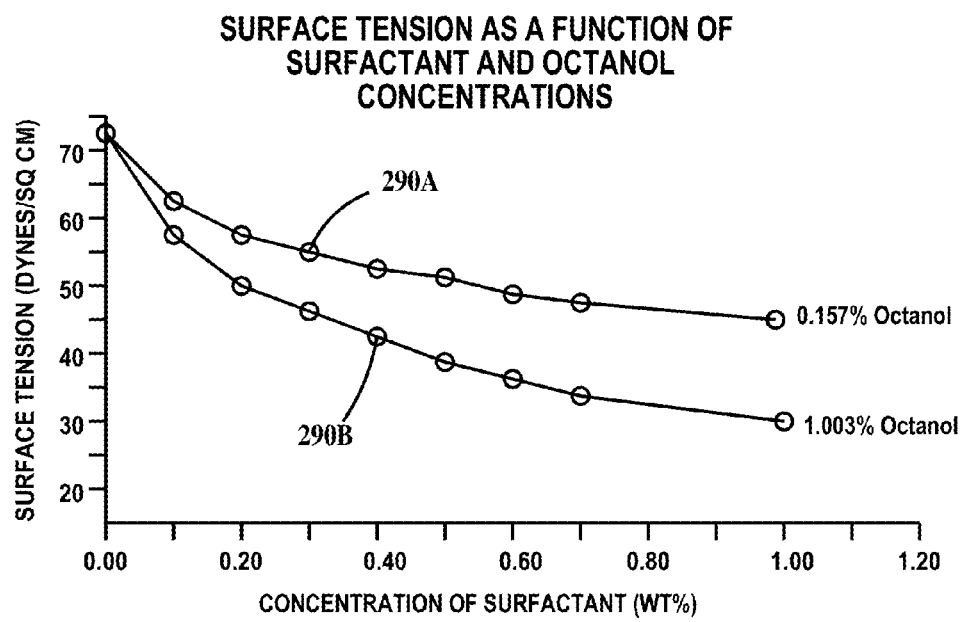
FIG. 5 is a plot of surface tension versus surfactant concentration for two concentrations of the additive octanol according to embodiments of the present invention.
Figure 6:
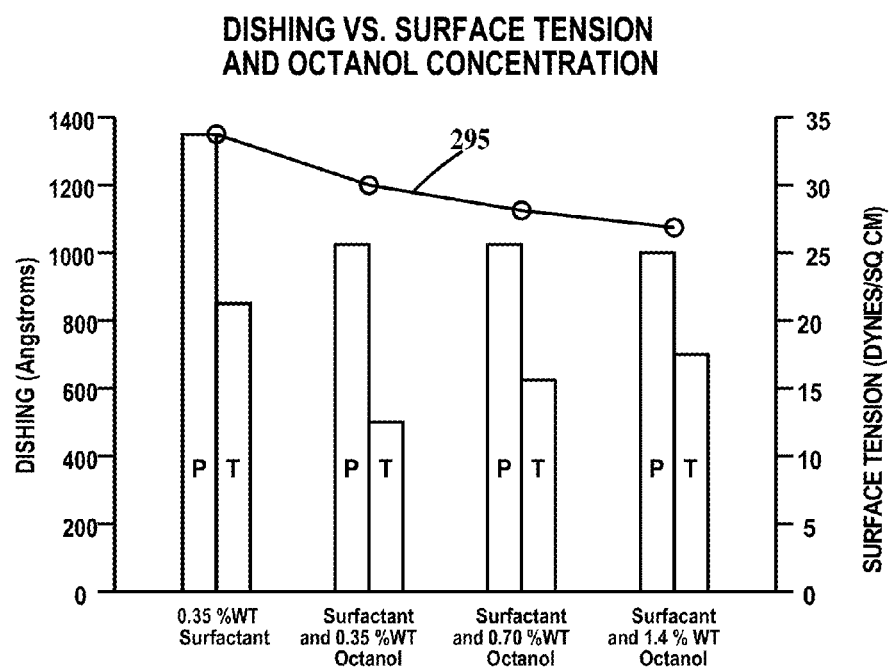
FIG. 6 is a chart relating surface tension, octanol concentration and dishing according to embodiments of the present invention.

FIG. 5 is a plot of surface tension versus surfactant concentration for two concentrations of the additive octanol according to embodiments of the present invention. The surfactant was sodium octyl sulfate. Curve 290A is a plot of surface tension vs. concentration of surfactant with 0.157% by weight of octanol added to an aqueous solution of the surfactant and concentration of surfactant between 0 and 1.0% by weigh surfactant. Curve 290B is a plot surface tension vs. concentration of surfactant with 1.003% by weight of octanol added to an aqueous solution of the surfactant and concentration of surfactant between 0 and 1.0% by weigh surfactant. In curve 290A the ratio of sodium octyl sulfate to octanol was about 210:1. In curve 290B the ratio of sodium octyl sulfate to octanol was about 33:1. Curves 290A and 290B show that the addition of octanol can increase the ability of surfactant to lower the surface tension of water. Lowering the surface tension increases the wetability of the surface being CMPed and increases the uniformity as shown in FIG. 6. While it appears that the same surface tension can be obtained with higher amounts of surfactant and less octanol, however the higher the surfactant concentration the more copper corrosion is seen. Thus it is preferred to use less surfactant and more octanol to achieve a given surface tension.

FIG. 6 is a chart relating surface tension, octanol concentration and dishing according to embodiments of the present invention. In FIG. 6, four CMP slurries were prepared using 0.35% by weight surfactant (sodium octyl sulfate). The first contained no octanol. The second contained 0.35% by weight of octanol. The third contained 0.70% by weight of octanol. The fourth contained 1.4% by weight of octanol. Both product wafers (bars labeled P) and test wafers (bars labeled T) were CMPed. The addition of 1-oxtanol significantly reduced the amount of dishing from about 1350 Å without octanol to about 1000 Å on the product wafers and from about 900 Å without octanol to about 625 Å on the test wafers. Curve 295 is a plot of the surface tension vs. octanol concentration. Without octanol, the surface tension was about 34 dynes/cm$^2$. With octanol, the surface tension ranged from about 30 dynes/cm$^2$ to about 27 dynes/cm$^2$ showing the reduction in dishing and in surface tension correlated. Thus no undue experimentation is required as simple surface tension measurements can point to a range of surfactant/alkyl alcohol concentrations to use in dishing experiments which require test or product wafers and a CMP apparatus along with its slurry mix and delivery system. Dishing was measured using a P10 profilometer.

Figure 7:
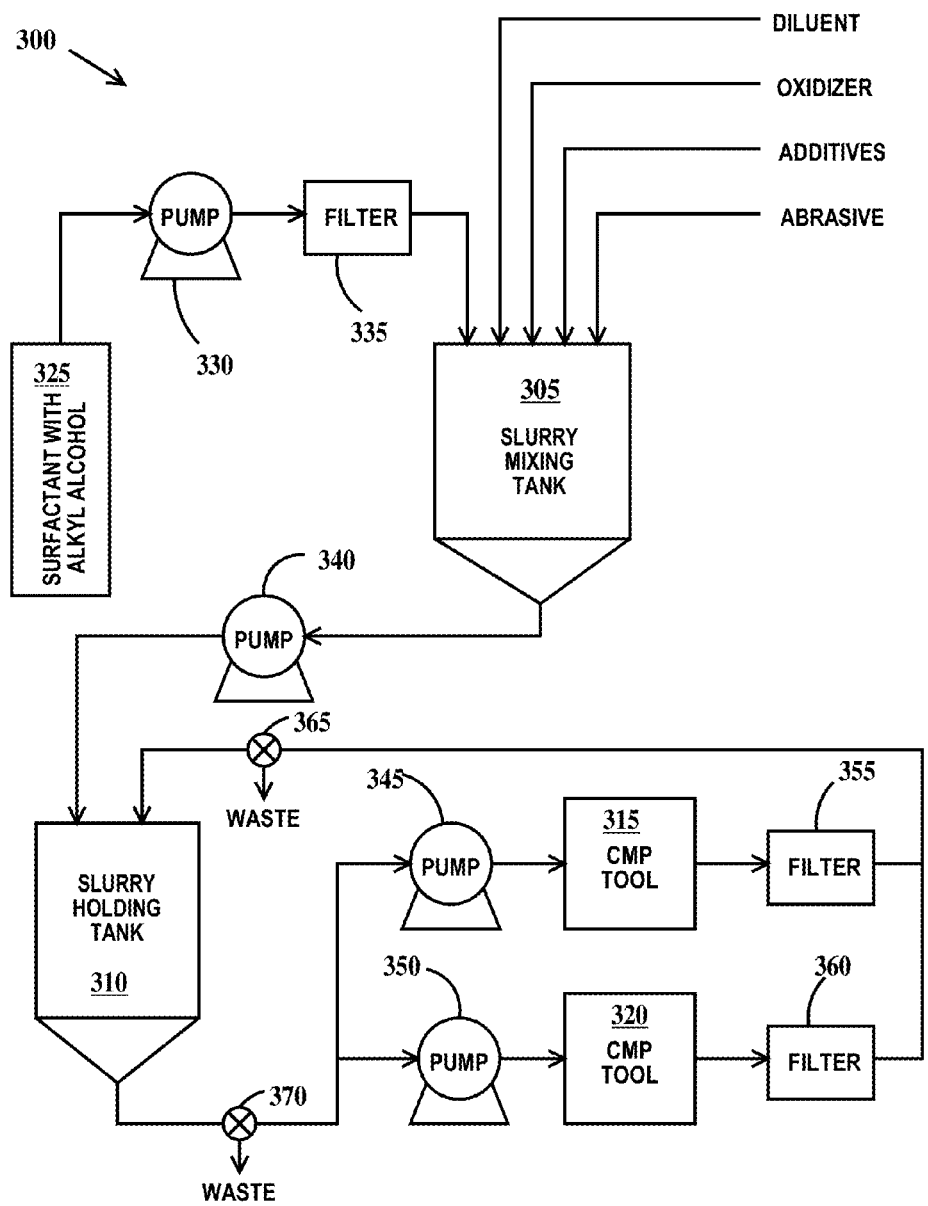
FIG. 7 is a schematic diagram of an exemplary slurry mixing and delivery system that may be used to practice the embodiments of the present invention.

FIG. 7 is a schematic diagram of an exemplary slurry mixing and delivery system that may be used to practice the embodiments of the present invention. In FIG. 7, a slurry mixing and delivery system 300 includes a slurry mixing tank, a slurry holding tank, CMP tools 315 and 320 and a surfactant tank 325. Surfactant tank 325 holds a solution of surfactant to which an alkyl alcohol as described supra has been added. The surfactant/alkyl alcohol is pumped by a pump 330 through a filter 335 to slurry mixing tank 305. Also added to slurry mixing tank are a diluent (e.g., water), an oxidizer (e.g., ferric nitrate), additives (e.g., chloride and sulfate anion sources and copper corrosion inhibiter) and an abrasive (e.g., alumina). Alternatively, the alkyl alcohol can be added to slurry mixing tank 305 directly. The mixed slurry is transferred to slurry holding tank 310 by pump 340. From slurry holding tanks 310, pumps 345 and 350 deliver slurry to CMP tools 315 and 320 respectively. Used slurry from CMP tools 315 and 320 is filtered by filters 355 and 360 respectively and delivered back to slurry holding tank 310. Provision is made by valves 365 and 370 to dispose used slurry to a waste stream for collection or treatment. While two CMP tools are illustrated, there may be one or more CMP tools.

Figure 8:
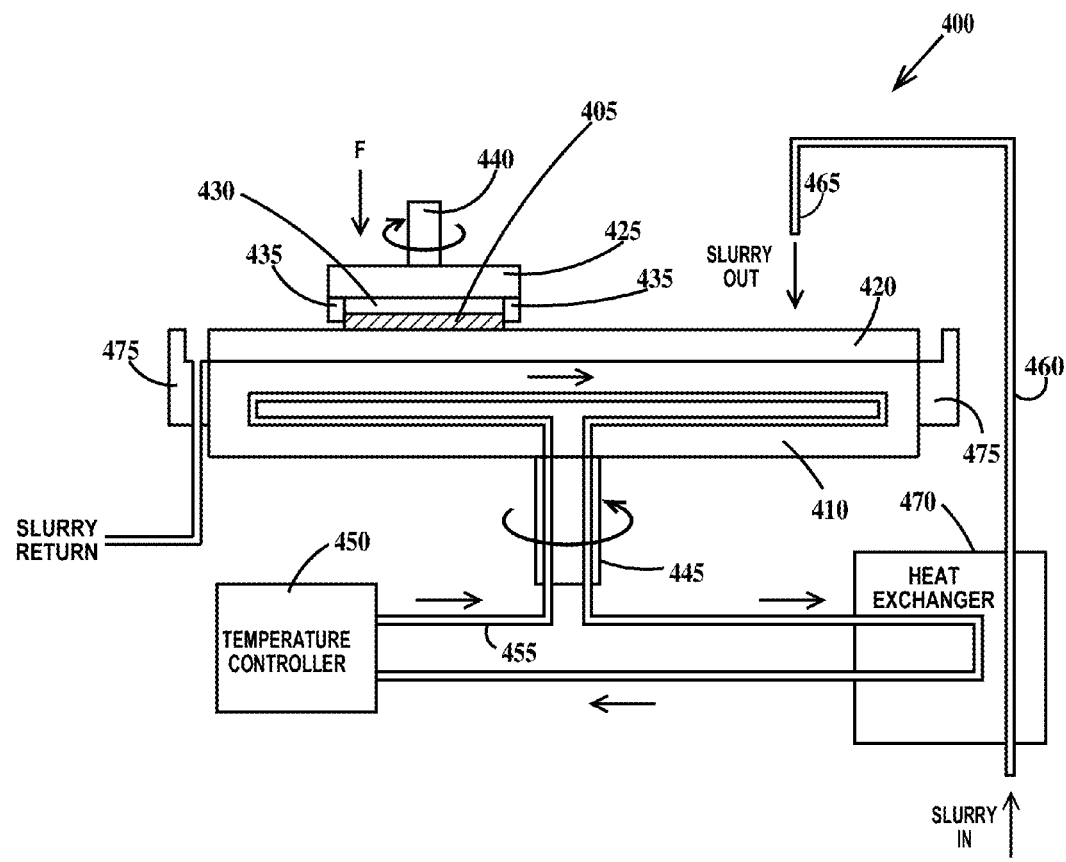
FIG. 8 is a schematic diagram of an exemplary chemical-mechanical polish tool that may be used to practice the embodiments of the present invention.

FIG. 8 is a schematic diagram of an exemplary chemical-mechanical polish tool that may be used to practice the embodiments of the present invention. In FIG. 8, a CMP apparatus 400 for planarization of a semiconductor substrate 405 placed top surface down on a pad 420 on a rotatable table 410. Pad 420 normally comprises a porous material. The pad material is capable of absorbing particulate matter such as silica or other abrasive materials.

Substrate 405 is held in a carrier 425. The backside of substrate 405 is held in contact with an insert pad 430 in carrier 425 by a vacuum. A retaining ring 435 is employed to prevent wafer 405 from slipping laterally from beneath carrier 425. A downward pressure "F" is applied by means of a shaft 440 attached to the backside of carrier 425. In one example, using the slurry compositions according to embodiments of the present invention, F is between about 2 psi and about 6 psi. This pressure is used to facilitate CMP of the upper surface of substrate 405.

During operation, carrier 425 typically rotates in a circular motion relative to table 410. Rotational movement of carrier 425 may be provided by coupling a motor (not shown) to shaft 440. Table 410 also rotates by means of a shaft 445. Rotational movement of table 410 may be provided by coupling a motor (not shown) to shaft 445. In one example, the relative rotational movements of carrier 425 and table 410 are counter-directional and, carrier 425 remains in a stationary position relative to shaft 445. In one example, carrier 425 rotates between about 10 and about 70 RMP with between about 15 RPM and 60 RPM preferred. In one example, table 410 rotates between about 10 and about 90 RMP with between about 40 RPM and 80 RPM preferred CMP apparatus 400 further includes an optional temperature controller 450 for heating a heat transfer fluid and pumping the heat transfer fluid through a pipe 455. Pipe 455 passes through the interior of table 410 so that the temperature of table 410 may be increased above room temperature during the polishing process. Heating of table 410 is optional.

CMP apparatus 400 further includes a pipe 460 for delivering slurry onto the surface of pad 420 during polishing. After being pumped thorough pipe 460, the slurry is directed onto the surface of pad 420 by nozzle 465. In an optional embodiment, the slurry is heated by temperature controller 450 through a heat exchanger 470. Heat exchanger 470 thermally couples portions of pipes 455 and 460 together so that the slurry passing through pipe 460 is maintained at the same temperature as that of the heating fluid flowing through pipe 455.

This the embodiments of the present invention provide a surfactant mixture, a slurry using the surfactant mixture and a method using the slurry that result in increased chemical polishing uniformity of damascene and dual damascene copper wires in integrated circuits.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   providing an aqueous slurry composition on a surface to be polished, said slurry composition comprising:
   between about 0.5% by weight and about 6% by weight abrasive particles;
   between about 1 gm/liter and about 50 gm/liter of ferric nitrate;
   between about 0.1 ml/liter and about 100 ml/liter of surfactant anion;
   between about 0.003 ml/liter and about 3.05 ml/liter of octanol; and
   water as a diluent; and
   polishing said surface by contacting said surface with a polishing pad.

2. The method of claim 1, wherein said surface is selected from the group consisting of copper, aluminum, tungsten, alloys of copper, alloys of aluminum and alloys of tungsten.

3. The method of claim 1, wherein during said polishing, said surface is pressed into said polishing pad with a down force while said surface and said polishing pad are rotating about axes perpendicular to said surface and a top surface of said polishing pad respectively.

4. The method of claim 1, wherein said surfactant anion is derived from sodium octyl sulfate.

5. A method, comprising:
   providing an aqueous slurry composition consisting essentially of:
   between about 0.5% by weight and about 6% by weight abrasive particles;
   between about 1 gm/liter and about 50 gm/liter of ferric nitrate;
   between about 0.1 ml/liter and about 100 ml/liter of surfactant anion;
   between about 0.1 gm/liter and about 5 gm/liter of a copper corrosion inhibitor;
   between about 0.003 ml/liter and about 3.05 ml/liter of octanol; and
   water as a diluent; and
   polishing said surface by contacting said surface with a polishing pad.

6. The method of claim 5, wherein said surface is selected from the group consisting of copper, aluminum, tungsten, alloys of copper, alloys of aluminum and alloys of tungsten.

7. The method of claim 5, wherein during said polishing, said surface is pressed into said polishing pad with a down force while said surface and said polishing pad are rotating about axes perpendicular to said surface and a top surface of said polishing pad respectively.

8. The method of claim 5, wherein said surfactant anion is derived from sodium octyl sulfate.

9. The method of claim 1 wherein said octanol is 1-octanol.

10. The method of claim 1, said slurry composition further comprising:
    between about 0.001 gm/liter and about 5 gm/liter of a chloride ion source; and
    between about 0.001 gm/liter and about 20 gm/liter a sulfate ion source.

11. The method of claim 1, said slurry composition further comprising:
    between about 0.1 gm/liter and about 5 gm/liter a copper corrosion inhibitor.

12. The method of claim 5, wherein said octanol is 1-octanol.

13. A method, comprising:
    providing an aqueous slurry composition on a surface to be polished, said slurry composition comprising:
    abrasive particles;
    ferric nitrate;
    a surfactant anion;
    octanol; and
    water as a diluent; and
    polishing said surface by contacting said surface with a polishing pad.

14. the method of claim 13, said slurry composition further comprising a copper corrosion inhibitor.

15. The method of claim 13, said slurry composition further comprising:
    a chloride ion source; and
    a sulfate ion source.

16. The method of claim 1, wherein the surface tension of said slurry composition is between 30 dynes/cm$^2$ and 27 dynes/cm$^2$.

17. The method of claim 5, wherein the surface tension of said slurry composition is between 30 dynes/cm$^2$ and 27 dynes/cm$^2$.

18. The method of claim 13, wherein the surface tension of said slurry composition is between 30 dynes/cm$^2$ and 27 dynes/cm$^2$.

* * * * *